(12) United States Patent
Lee et al.

(10) Patent No.: US 8,675,157 B2
(45) Date of Patent: Mar. 18, 2014

(54) THIN-FILM TRANSISTOR DISPLAY PANEL AND LIQUID CRYSTAL DISPLAY INCLUDING THE SAME

(75) Inventors: Seong-Young Lee, Anyang-si (KR); Jae-Ho Choi, Seoul (KR); Joon-Chul Goh, Hwaseong-si (KR); Young-Soo Yoon, Anyang-si (KR)

(73) Assignee: Samsung Display Co., Ltd. (KR)

( * ) Notice: Subject to any disclaimer, the term of this patent is extended or adjusted under 35 U.S.C. 154(b) by 66 days.

(21) Appl. No.: 13/200,868

(22) Filed: Oct. 4, 2011

(65) Prior Publication Data

US 2012/0147310 A1 Jun. 14, 2012

(30) Foreign Application Priority Data

Dec. 14, 2010 (KR) ........................ 10-2010-0127637

(51) Int. Cl.
G02F 1/1335 (2006.01)
G02F 1/1337 (2006.01)
G02F 1/1343 (2006.01)

(52) U.S. Cl.
USPC ............ 349/109; 349/106; 349/129; 349/144

(58) Field of Classification Search
USPC .......................... 349/109, 144, 129, 146, 106
See application file for complete search history.

(56) References Cited

U.S. PATENT DOCUMENTS

| 6,940,575 B2 * | 9/2005 | Sunohara et al. ............. 349/142 |
| 6,965,419 B2 * | 11/2005 | Nishida et al. ................ 349/106 |
| 2005/0036091 A1 * | 2/2005 | Song .............................. 349/129 |
| 2008/0079885 A1 * | 4/2008 | Lee et al. ...................... 349/144 |

FOREIGN PATENT DOCUMENTS

| JP | 2007-140053 A | 6/2007 |
| KR | 1020030015533 A | 2/2003 |
| KR | 1020060058738 A | 5/2006 |

* cited by examiner

*Primary Examiner* — Nathanael R Briggs
(74) *Attorney, Agent, or Firm* — Innovation Counsel LLP

(57) ABSTRACT

Provided are a thin-film transistor (TFT) display panel in which grayscale inversion at sides of the TFT display panel is controlled to improve color at sides thereof due to the shifting of chromaticity coordinates, and a liquid crystal display (LCD) including the TFT display panel. The TFT display panel includes a first pixel electrode corresponding to a first pixel, a second pixel electrode corresponding to a second pixel, and a third pixel electrode corresponding to a third pixel, wherein each of the first through third pixel electrodes includes a first subpixel electrode and a second subpixel electrode which receive different data voltages from the data lines, and saw-toothed fine patterns are formed on oblique edges of the first subpixel electrode of the first pixel electrode.

18 Claims, 13 Drawing Sheets

THIN-FILM TRANSISTOR DISPLAY PANEL AND LIQUID CRYSTAL DISPLAY INCLUDING THE SAME

This application claims priority from Korean Patent Application No. 10-2010-0127637 filed on Dec. 14, 2010 in the Korean Intellectual Property Office, the disclosure of which is incorporated herein by reference in its entirety.

BACKGROUND

1. Field of the Invention

The subject matter disclosed herein relates to a thin-film transistor (TFT) display panel and a liquid crystal display (LCD) including the same.

2. Description of the Related Art

Liquid crystal displays (LCDs) are one of the most widely used types of flat panel displays. Generally, an LCD includes a pair of display panels having electric field generating electrodes and a liquid crystal layer interposed between the display panels. In an LCD, voltages are applied to electric field generating electrodes to generate an electric field in a liquid crystal layer. Accordingly, the alignment of liquid crystal molecules of the liquid crystal layer is determined, and polarization of incident light is controlled. As a result, a desired image is displayed on the LCD.

In a vertical alignment (VA) mode LCD, liquid crystal molecules are arranged with the long axes of the molecules being perpendicular to the upper and lower display panels when no electric field is applied to the liquid crystal molecules. VA mode LCDs are popular due to their high contrast ratios and wide standard viewing angles.

In order to widen a standard viewing angle of a VA mode LCD, cutouts may be formed in electric field generating electrodes or protrusions may be formed on the electric field generating electrodes. The cutouts or protrusions can determine the directions in which the liquid crystal molecules tilt. By using cutouts or protrusions to control the orientation of the liquid crystal molecules, the standard viewing angle of the VA mode LCD can be increased.

However, in a patterned vertically alignment (PVA) mode LCD having cutouts, the screen appears yellow at the sides due to the shifting of chromaticity coordinates at the sides of the PVA mode LCD. Therefore, the shifting of the chromaticity coordinates at the sides of the PVA mode LCD needs to be improved in order to enhance the display quality of the PVA mode LCD.

SUMMARY

Aspects of the claimed subject matter provide a thin-film transistor (TFT) display panel in which grayscale inversion at sides of the TFT display panel is controlled to improve a phenomenon in which a screen is colored in a certain color at sides thereof due to the shifting of chromaticity coordinates.

Aspects of the claimed subject matter also provide a liquid crystal display (LCD) including a TFT display panel in which grayscale inversion at sides of the TFT display panel is controlled to improve a phenomenon in which a screen is colored in a certain color at sides thereof due to the shifting of chromaticity coordinates.

However, aspects of the claimed subject matter are not restricted to the one set forth herein. The above and other aspects will become more apparent to one of ordinary skill in the art to which it pertains by referencing the detailed description given below.

According to one embodiment, there is provided a TFT display panel including: a first substrate; a plurality of gate lines formed on the first substrate and extending in a first direction; a plurality of data lines intersecting the gate lines and extending in a second direction; a plurality of pixel regions defined by the gate lines and the data lines; and a plurality of pixel electrodes formed in the pixel regions and including a first pixel electrode corresponding to a first pixel, a second pixel electrode corresponding to a second pixel, and a third pixel electrode corresponding to a third pixel, wherein each of the first through third pixel electrodes includes a first subpixel electrode and a second subpixel electrode which receive different data voltages from the data lines, and saw-toothed fine patterns are formed on oblique edges of the first subpixel electrode of the first pixel electrode.

According to another embodiment, there is provided an LCD including: a first display panel including a first insulating substrate and a common electrode which is formed on the first insulating substrate and is partitioned into a plurality of pixel portions comprising a first pixel portion facing a first pixel electrode, a second pixel portion facing a second pixel electrode, and a third pixel portion facing a third pixel electrode; and a second display panel including a second insulating substrate, a plurality of pixel electrodes which are formed on the second insulating substrate and include the first pixel electrode corresponding to a first pixel, the second pixel electrode corresponding to a second pixel and the third pixel electrode corresponding to a third pixel, and a plurality of data lines which apply data voltages to the pixel electrodes, wherein the first pixel electrode includes a first subpixel electrode and a second subpixel electrode which receive different data voltages from the data lines, and saw-toothed fine patterns are formed on oblique edges of the first subpixel electrode.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other aspects and features will become more apparent by describing in detail exemplary embodiments thereof with reference to the attached drawings, in which.

DETAILED DESCRIPTION

Figure 1:
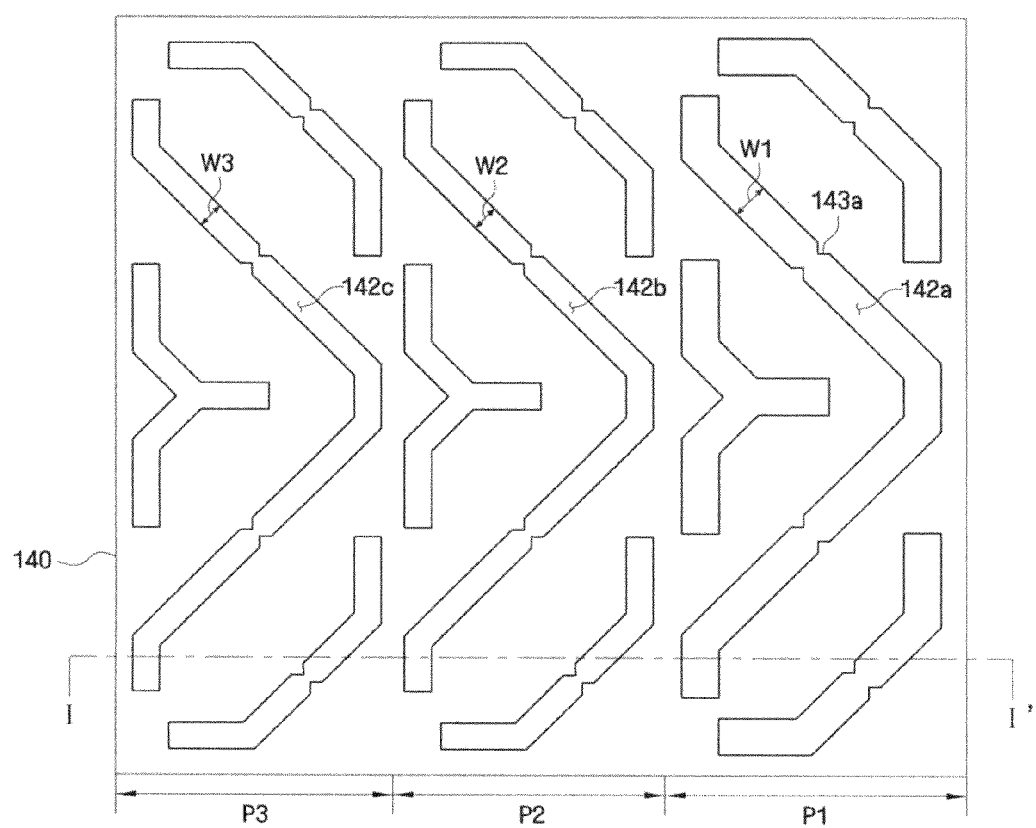
FIG. 1 is a plan view of a common electrode display panel according to an exemplary embodiment.

Advantages and features of the claimed subject matter and methods of accomplishing the same may be understood more readily by reference to the following detailed description of exemplary embodiments and the accompanying drawings. The claimed subject matter may, however, be embodied in many different forms and should not be construed as being limited to the embodiments set forth herein. Rather, these embodiments are provided so that this disclosure will be thorough and complete and will fully convey the concept of the claimed subject matter to those skilled in the art, and will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the claimed subject matter are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, exemplary embodiments will be described in further detail with reference to the accompanying drawings.

A thin-film transistor (TFT) display panel and a liquid crystal display (LCD) according to an exemplary embodiment will now be described with reference to FIGS. 1 through 5. The LCD according to the exemplary embodiment includes a TFT display panel having TFTs which apply voltages to pixel electrodes, a common electrode display panel facing the TFT display panel and having a common electrode, and a liquid crystal layer aligned vertically between the TFT display panel and the common electrode display panel.

Figure 2:
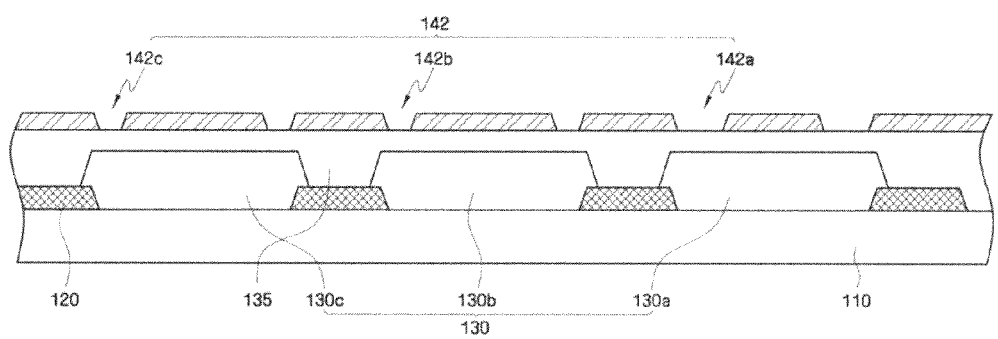
FIG. 2 is a cross-sectional view of the common electrode display panel taken along the line I-I' of FIG. 1.

First, the common electrode display panel of the LCD according to the exemplary embodiment of will be described with reference to FIGS. 1 and 2. FIG. 1 is a plan view of a common electrode display panel of an LCD according to an exemplary embodiment. FIG. 2 is a cross-sectional view of the common electrode display panel taken along the line I-I' of FIG. 1.

Referring to FIGS. 1 and 2, the common electrode display panel of the LCD according to the exemplary embodiment includes an insulating substrate 110, a black matrix 120, color filters 130, an overcoat layer 135, and a common electrode 140.

The insulating substrate 110 may be made of a transparent insulating material such as glass or transparent plastic.

The black matrix 120 is formed on the insulating substrate 110, prevents leakage of light, and defines pixel regions. The black matrix 120 may be made of metal or metal oxide, such as chrome or chrome oxide, or organic black resist.

The color filters 130 are formed in the pixel regions between the black matrices 120. The color filters 130 may include red, green and blue color filters 130a through 130c. The red, green and blue color filters 130a through 130c may be sequentially arranged in the pixel regions surrounded by the black matrix 120. In addition, the red, green and blue color filters 130a through 130c may be placed to overlap first through third pixel electrodes 82a through 82c of a TFT display panel which will be described later. The overcoat layer 135 may be formed on top surfaces of the color filter 130 to planarize the step difference between the color filters 130.

The common electrode 140 is disposed on the overcoat layer 130 and may be made of a transparent conductive material such as indium tin oxide (ITO) or indium zinc oxide (IZO). An alignment film (not shown) for aligning liquid crystal molecules may be formed on the common electrode 140.

The common electrode 140 faces pixel electrodes 82 of the TFT display panel which will be described later. The common electrode 140 may be divided into a plurality of pixel portions including a first pixel portion P1 which faces the first pixel electrode 82a, a second pixel portion P2 which faces the second pixel electrode 82b, and a third pixel portion P3 which faces the third pixel electrode 82c.

The common electrode 140 may be partitioned into a plurality of regions by domain partition portions. The domain partition portions may be gaps 142a through 142c formed by cutout patterns. Each of the gaps 142a through 142c include oblique portions and end portions. The oblique portions are arranged alternately with and parallel to oblique portions of a gap of a pixel electrode and are at a predetermined angle with respect to a gate line, as will be described later. The end portions overlap edges of the pixel electrode and include vertical and horizontal ends.

The gaps 142a formed in the first pixel portion P1 of the common electrode 140 may be wider than the gaps 142b and 142c formed in the second and third pixel portions P2 and P3. Here, the first pixel portion P1 may correspond to a blue pixel, and each of the second and third pixel portions P2 and P3 may correspond to any one of red and green pixels.

The first through third pixel portions P1 through P3 correspond to first through third pixels, respectively. Each pixel has a different transmittance and shows grayscale inversion at a different voltage. Such differences bring about a phenomenon in which a certain color is predominantly displayed on a display screen. Gaps 142 of the common electrode 140 have different gamma curves from those of regions other than the gaps 142. Therefore, if pixels are controlled to have similar transmittances and show grayscale inversion at similar voltages by adjusting widths of the gaps 142, the phenomenon in which the display screen is colored predominantly in a certain color can be improved.

In particular, in a patterned vertically alignment (PVA) mode LCD having cutouts, the grayscale inversion of blue occurs earlier than those of red and green at the sides of the PVA mode LCD. This causes chromaticity coordinates to shift toward red and green, thereby coloring the display screen in yellow. In an exemplary, the gaps 142a of the blue pixel portion (i.e., the first pixel portion P1) of the common electrode 140 are formed wider than the gaps 142b and 142c of the red and green pixel portions (i.e., the second and third pixel portions P2 and P3) of the common electrode 140, as shown in FIG. 1. Therefore, the grayscale inversion of blue can be controlled to occur at a similar time to those of red and green, and, accordingly, the phenomenon in which the display screen is colored in yellow can be improved.

Not all of the gaps 142a formed in the first pixel portion P1 of the common electrode 140 may be wider than the gaps 142b and 142c formed in the second and third pixel portions P2 and P3. For example, a width W1 of any one of the gaps 142a formed in the first pixel portion P1 may be greater than widths W2 and W3 of the gaps 142b and 142c formed in the second and third pixel portions P2 and P3 at locations corresponding to the location of the gap 142a.

The difference between the width of any one gap formed in the first pixel portion P1 and those of corresponding gaps formed in the second and third pixel portions P2 and P3 may be 2 to 10 micrometers. When the difference in gap width between the first pixel portion P1 and the second and third pixel portions P2 and P3 is 2 micrometers or greater, the transmittance and grayscale inversion of each pixel are adjusted to be similar to those of another, thereby improving the phenomenon in which the display screen is colored in a certain color, especially, in yellow. When the difference in gap width is less than 10 micrometers, the transmittance of each pixel does not decrease. As long as the gaps 142a of the first pixel portion P1 are wider than the gaps 142b and 142c of the second and third pixel portions P2 and P3, the widths of the gaps 142b of the second pixel portion P2 can be either equal to or different from those of the gaps 142c of the third pixel portion P3.

When a total area of the gaps 142a formed in the first pixel portion P1 of the common electrode 140 is greater than those of the gaps 142b and 142c formed in the second and third pixel portion P2 and P3, the grayscale inversion of a pixel corresponding to the first pixel portion P1 can also be adjusted, thereby improving the phenomenon in which the display screen is colored in a certain color. Here, the first pixel portion P1 may correspond to a blue pixel. The 'total area' denotes the sum of areas of all gaps.

Notches 143a that can prevent formation of stains or afterimage may be formed in the gaps 142, specifically, in the oblique portions of the gaps 142. The notches 143a may be protruding or recessed notches. A width of a gap having notches refers to a width of the gap at a location where the notches are not formed.

Figure 3:
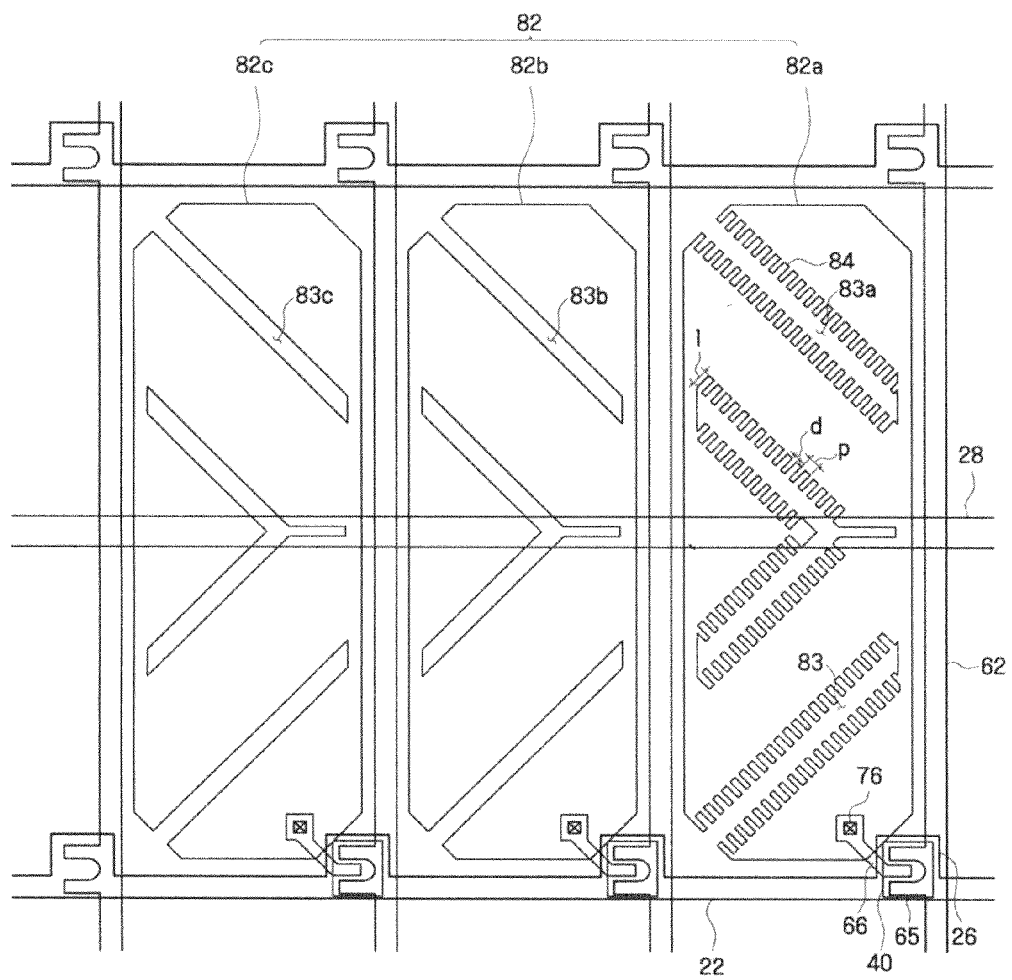
FIG. 3 is a plan view of a thin-film transistor (TFT) display panel according to an exemplary embodiment.
Figure 4:
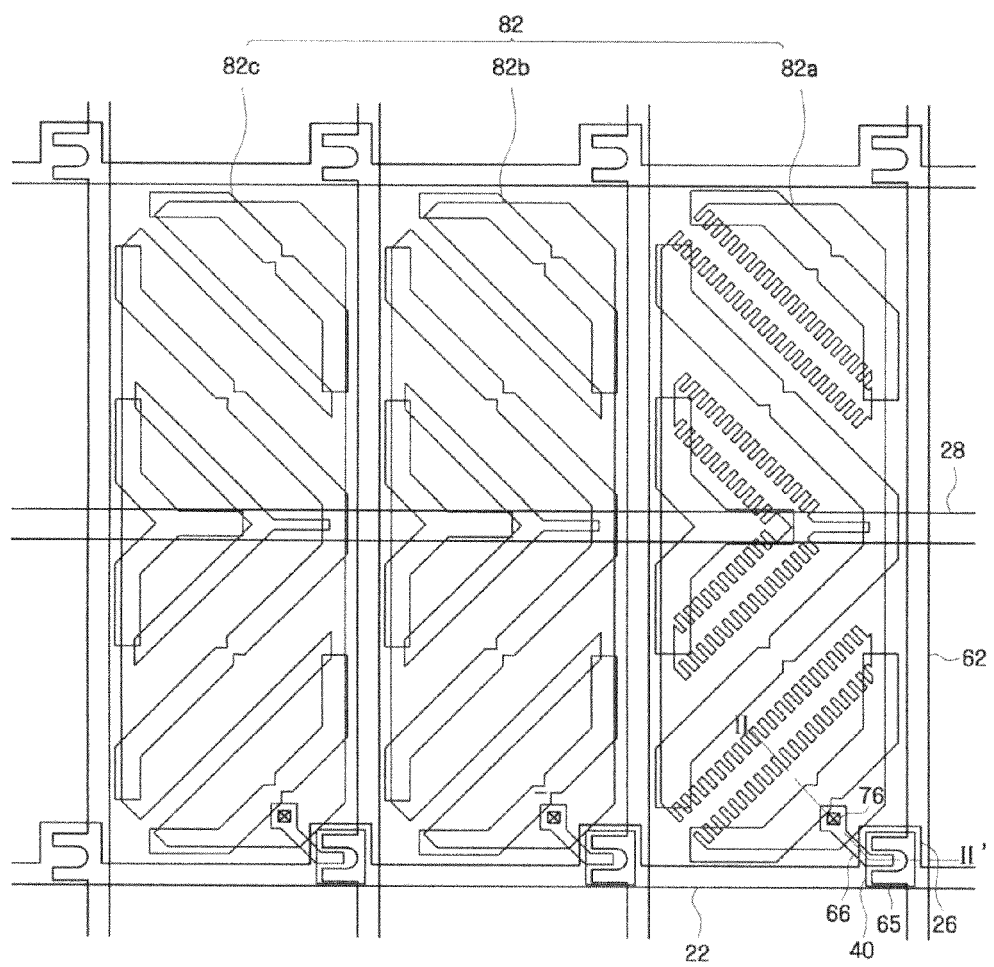
FIG. 4 is a plan view of a liquid crystal display (LCD) according to an exemplary embodiment in which the common electrode display panel of FIG. 1 is coupled to the TFT display panel of FIG. 3.
Figure 5:
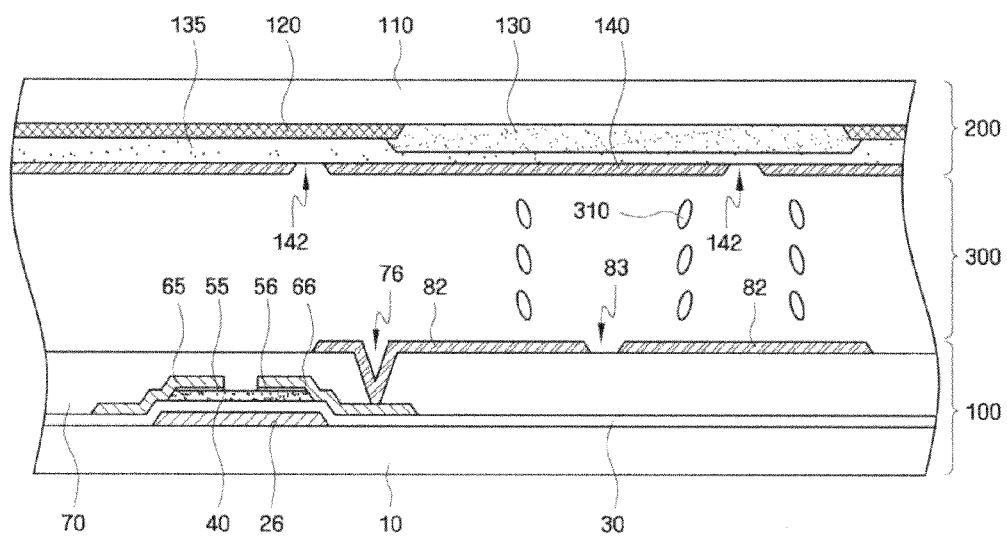
FIG. 5 is a cross-sectional view of the LCD taken along the line II-II' of FIG. 4.

Hereinafter, a TFT display panel and an LCD including the same according to the exemplary embodiment will be described with reference to FIGS. 3 and 5. FIG. 3 is a plan view of a TFT display panel according to an exemplary embodiment. FIG. 4 is a plan view of an LCD in which the common electrode display panel of FIG. 1 is coupled to the TFT display panel of FIG. 3. FIG. 5 is a cross-sectional view of the LCD taken along the line II-II' of FIG. 4.

Referring to FIGS. 3 and 5, the TFT display panel of the LCD according to the current exemplary embodiment includes an insulating substrate 10, a gate electrode 26, a gate insulating film 30, a semiconductor layer 40, ohmic contact layers 55 and 56, a source electrode 65, a drain electrode 66, a passivation film 70, and a pixel electrode 82.

The insulating substrate 10 is made of an insulating material such as transparent glass. A gate line 22 extends in a first direction, e.g., a horizontal direction, on the insulating substrate 10. The gate line 22 transmits a gate signal and is allocated to each pixel.

The gate electrode 26 projects from the gate line 22 in the form of a protrusion. The gate line 22 and the gate electrodes 26 are referred to as gate wirings.

A storage wiring 28 may be formed on the insulating substrate 10. The storage wiring 28 extends in the horizontal direction to be substantially parallel to the gate line 22 and overlaps the pixel electrode 82, which will be described later, in each pixel. In the current exemplary embodiment illustrated in FIG. 3, the storage wiring 28 is situated in the middle of each pixel. However, the claimed subject matter is not limited thereto. The shape and disposition of the storage wiring 28 can vary as long as the storage wiring 28 overlaps the pixel electrode 82 to form a storage capacitance.

The gate wirings (22 and 26) and the storage wiring 28 may be formed of aluminum (Al)-based metal, such as aluminum and an aluminum alloy, silver (Ag)-based metal, such as silver and a silver alloy, copper (Cu)-based metal such as copper and a copper alloy, molybdenum (Mo)-based metal, such as molybdenum and a molybdenum alloy, chrome (Cr), titanium (Ti) or tantalum (Ta).

In addition, the gate wirings (22 and 26) and the storage wiring 28 may have a multi-film structure composed of two conductive films (not shown) with different physical characteristics. One of the two conductive films may be formed of metal with low resistivity, such as aluminum-based metal, silver-based metal or copper-based metal, in order to reduce a signal delay or a voltage drop of the gate wirings (22 and 26) and the storage wiring 28. The other one of the conductive films may be formed of a different material, in particular, a material having superior contact characteristics with ITO and IZO, such as molybdenum-based metal, chrome, titanium, or tantalum. Examples of multi-film structures include a chrome lower film and an aluminum upper film and an aluminum lower film and a molybdenum upper film. However, the claimed subject matter is not limited thereto. The gate wirings (22 and 26) and the storage wiring 28 may be formed of various metals and conductors.

The gate insulating film 30, which may be formed of silicon nitride (SiNx) or silicon oxide (SiO$_2$), is disposed on the gate wiring (22 and 26) and the storage wiring 28.

The semiconductor layer 40 is disposed on the gate insulating film 30 and made of hydrogenated amorphous silicon or polycrystalline silicon. The semiconductor layer 40 may have various shapes. For example, the semiconductor layer 40 may be an island or may be formed linearly. In FIG. 5, the semiconductor layer 40 is an island formed on the gate electrode 26.

The ohmic contact layers 55 and 56 are disposed on the semiconductor layer 40 and are formed of a material such as silicide or n+ hydrogenated amorphous silicon heavily doped with n-type impurities. The ohmic contact layers 55 and 56 may have various shapes. For example, the ohmic contact layers 55 and 56 may be islands or may be formed linearly.

When the ohmic contact layers 55 and 56 are islands as shown in FIG. 5, they may be disposed under the drain electrode 66 and the source electrode 56.

A data line 62 is formed on the ohmic contact layers 55 and 56 and the gate insulating film 30. The data line 62 extends in a second direction, e.g., a vertical direction and intersects the gate line 22 to define each pixel.

The source electrode 65 branches from the data line 62 and extends onto the semiconductor layer 40.

The drain electrode 66 is formed on the ohmic contact layers 55 and 56 and the gate insulating film 30. The drain electrode 66 is separated from the source electrode 65 and is disposed on the semiconductor layer 40 to face the source electrode 65 with respect to the gate electrode 26. The drain electrode 66 includes a bar-shaped pattern which is disposed on the semiconductor layer 40 and an extension pattern which extends from the bar-shaped pattern, has a wide area, and in which a contact hole 76 is situated. The data line 62, the source electrode 65, and the drain electrode 66 are referred to as data wirings.

The data wirings (62, 65 and 66) may be formed of chrome, molybdenum-based metal, or refractory metal such as tantalum and titanium. In addition, the data wirings (62, 65 and 66) may have a multi-film structure (not shown) composed of a lower film (not shown), which is formed of refractory metal, and an upper film (not shown), which is formed of a material with low resistivity and is disposed on the lower film. Examples of multi-film structures include a chrome lower film and an aluminum upper film and an aluminum lower film and a molybdenum upper film. Alternatively, the multi-film structure may be a three-film structure having molybdenum-aluminum-molybdenum films.

At least a portion of the source electrode 65 overlaps the semiconductor layer 40. In addition, the drain electrode 66 faces the source electrode 65 with respect to the gate electrode 26, and at least a portion of the drain electrode 66 overlaps the semiconductor layer 40. The ohmic contact layers 55 and 56 may be arranged between the semiconductor layer 40 and the source electrode 65 and between the semiconductor layer 40 and the drain electrode 66 to reduce contact resistance between them.

The passivation film 70 is disposed on the data line 62, the drain electrode 66 and an exposed portion of the semiconductor layer 40. The passivation film 70 may be formed of an inorganic material such as silicon nitride or silicon oxide, an organic material having photosensitivity and superior planarization characteristics, or a low-k insulating material formed by plasma enhanced chemical vapor deposition (PECVD), such as a-Si:C:O or a-Si:O:F. The passivation film 70 may be composed of a lower inorganic film and an upper organic film in order to protect the exposed portion of the semiconductor layer 40 while taking advantage of the superior characteristics of an organic layer.

The pixel electrode 82 is formed on the passivation film 70 and is electrically connected to the drain electrode 66 through the contact hole 76 in each pixel. That is, the pixel electrode 82 is physically and electrically connected to the drain electrode 66 through the contact hole 76 and thus receives a data voltage from the drain electrode 66. The pixel electrode 82 may be formed of a transparent conductor, such as ITO or IZO, or a reflective conductor such as aluminum. An alignment film (not shown) for aligning liquid crystal molecules may be coated on the pixel electrode 82 and the passivation film 70.

The pixel electrode 82 is partitioned into a plurality of regions by gaps 83a, 83b or 83c formed by cutout patterns. Each of the gaps 83a, 83b or 83c includes a horizontal portion extending horizontally at a location that divides the pixel electrode 82 into upper and lower parts and oblique portions formed in the upper and lower parts of the pixel electrode 82, respectively. The upper and lower oblique portions may be perpendicular to each other in order to evenly distribute a horizontal electric field in four directions. One of the oblique portions may be at an angle of substantially 45 degrees with respect to the gate line 22, and the other one may be at an angle of substantially −45 degrees with respect to the gate line 22. Each gap may have a mirrored structure in which its upper and lower parts are substantially symmetrical to each other with respect to a line (parallel to the gate line 22) that divides a pixel region into upper and lower regions. For example, as shown in FIG. 3, an oblique portion of a gap, which is at an angle of substantially 45 degrees to the gate line 22, may be formed in a part of the pixel electrode 82 above the middle of a pixel, and an oblique portion of the gap, which is at an angle of substantially −45 degrees to the gate line 22, may be formed in the other part of the pixel electrode 82 below the middle of the pixel. However, the claimed subject matter is not limited thereto. The shape and disposition of an oblique portion of each gap may vary as long as the oblique portion is at a predetermined angle with respect to the gate line 22. In particular, the oblique portion may have notches (not shown) that can prevent the formation of stains or afterimage. However, the notches are optional.

The pixel electrode 82 may be defined as the first pixel electrode 82a, the second pixel electrode 82b, or the third pixel electrode 82c corresponding to each pixel. As shown in FIG. 3, the TFT display panel according to the exemplary embodiment may have saw-toothed fine patterns 84 formed on edges, preferably oblique edges of the first pixel electrode 82a. On the other hand, no fine patterns may be formed on edges, preferably oblique edges of the second and third pixel electrodes 82b and 82c. The first pixel electrode 82a may correspond to a blue pixel.

Edges with the fine patterns 84 have different gamma curves from that of an inside bulk region of the pixel electrode. Therefore, transmittance and gray voltage can be adjusted by forming the fine patterns 84 on a pixel electrode. For example, as shown in FIG. 3, the fine patterns 84 may be formed on the oblique edges of the first pixel electrode 82a which corresponds to a blue pixel and may not be formed on the oblique edges of the second and third pixel electrodes 82b and 82c, each of which corresponds to a red or green pixel. In this case, the grayscale inversion of the blue pixel at the sides of a PVA mode LCD is delayed. Accordingly, the grayscale inversion of the blue pixel is controlled to occur at a similar time to those of other pixels, and this improves the phenomenon in which the screen appears yellow due to the shifting of the chromaticity coordinates. Meanwhile, not all gaps of the first pixel electrode 82a may necessarily have the fine patterns 84 as long as at least one gap has the fine patterns 84.

The fine patterns 84 include a plurality of protrusions extending perpendicularly from each edge of the first pixel electrode 82a. The protrusions that constitute the fine patterns 84 may be at an angle of approximately 45 or −45 degrees to the gate line 22. A length "l" of the protrusions of the fine patterns 84 in a direction perpendicular to each edge of the first pixel electrode 82a may be 5 to 15 micrometers. In addition, a distance "d" between one of the protrusions and another protrusion adjacent to the protrusion may be 4 micrometers or less, and a sum "p" of the distance "d" between adjacent protrusions and a width of one protrusion may be 8 micrometers or less. When fine patterns with dimensions in the above ranges are formed on a pixel electrode, the grayscale inversion of a pixel corresponding to the pixel electrode may be controlled without a reduction in the transmittance of the pixel. As a result, the phenomenon in which the display screen is colored in a certain color can be effectively improved.

FIG. 4 is a plan view of an LCD according to an exemplary embodiment in which the common electrode display panel of FIG. 1 is coupled to the TFT display panel of FIG. 3. Referring to FIG. 4, the oblique portions of the gaps 83a through 83c of the pixel electrodes 82 and the oblique portions of the gaps 142a through 142c of the common electrode 140 may be arranged parallel to one another and in the same direction. In addition, the oblique portions of the gaps 83a through 83c of the pixel electrodes 82 are arranged alternately with the oblique portions of the gaps 142a through 142c of the common electrode 140. The gaps 83a, 83b or 83c of each pixel electrodes 82 and the gaps 142a, 142b or 142c of the common electrode 140 partition a display region of the pixel electrode 82 into a plurality of domains according to a direction in which main directors of liquid crystal molecules included in a liquid crystal layer are aligned when an electric field is applied to the liquid crystal layer. Here, a domain denotes a region having liquid crystal molecules whose directors tilt together in a certain direction due to an electric field formed between the pixel electrode 82 and the common electrode 140.

Referring to FIG. 5, the TFT display panel 100 and the common electrode display panel 200 may be aligned and coupled to each other, and a liquid crystal layer 300 including liquid crystal molecules 310 may be formed and aligned vertically between the TFT display panel 100 and the common electrode display panel 200. As a result, the basic structure of the LCD according to the exemplary embodiment is completed.

In a state where no electric field is applied between the pixel electrode 82 and the common electrode 140, the liquid crystal molecules 310 included in the liquid crystal layer 300 have negative dielectric anisotropy and are aligned such that their directors are perpendicular to the TFT display panel 100 and the common electrode display panel 200. The TFT display panel 100 and the common electrode display panel 200 are aligned such that the pixel electrodes 82 correspond and are precisely overlapped by the color filters 130. Accordingly, each pixel is partitioned into a plurality of domains by the gaps 83a, 83b or 83c of the pixel electrode 82 and the corresponding gaps 142a, 142b or 142c of the common electrode 140. The LCD is completed by adding elements such as a backlight to this basic structure.

Figure 6:
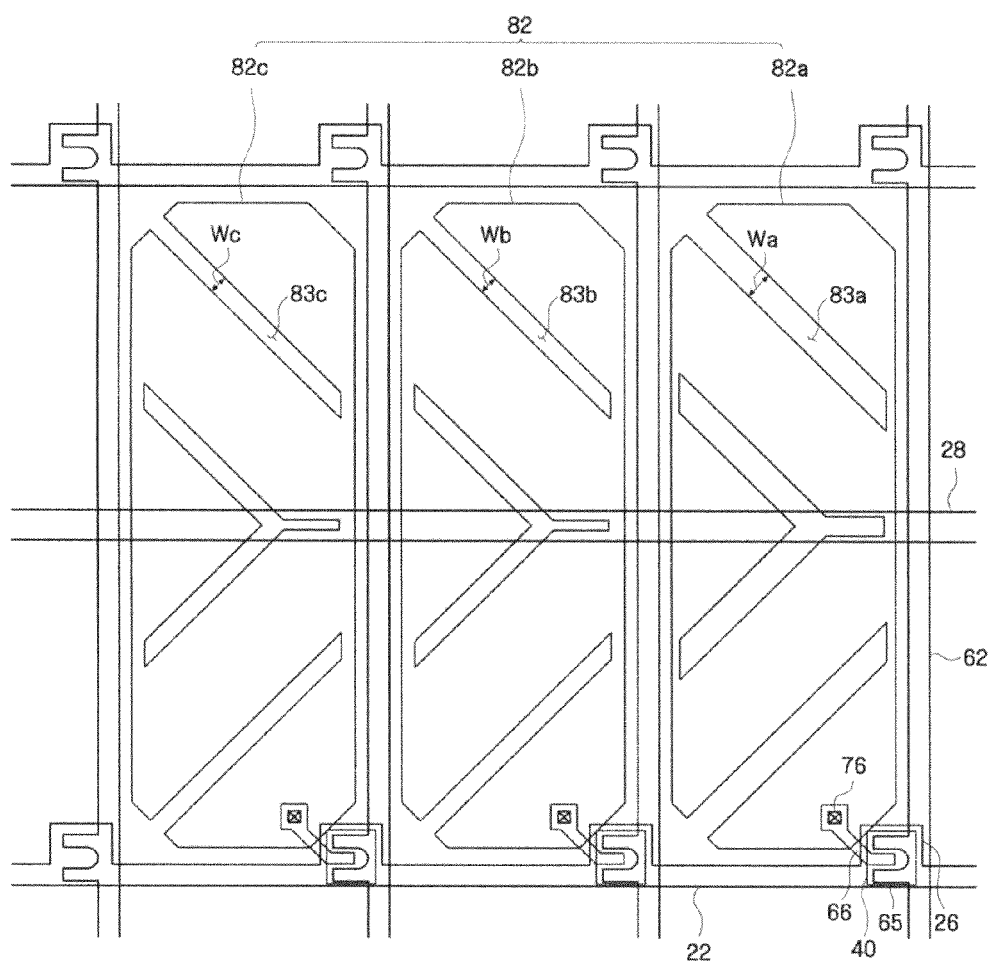
FIG. 6 is a plan view of a TFT display panel according to another exemplary embodiment.

Hereinafter, a TFT display panel and an LCD including the same according to another exemplary embodiment will be described with reference to FIG. 6. For simplicity, elements having the same functions as those of the exemplary embodiment illustrated in FIGS. 1 through 5 are indicated by like reference numerals, and thus their description will be omitted. FIG. 6 is a plan view of a TFT display panel according to another exemplary embodiment. The TFT display panel according to the current exemplary embodiment has basically the same structure as the TFT display panel according to the previous exemplary embodiment, except for the following features.

Referring to FIG. 6, in the TFT display panel according to the current exemplary embodiment, gaps 83a of a first pixel electrode 82a may be wider than gaps 83b and 83c of second and third pixel electrodes 82b and 82c. Here, the first pixel electrode 82a may corresponds to a blue pixel, and each of the second and third pixel electrodes 82b and 82c may correspond to any one of red and green pixels.

When a width Wa of the gaps 83a of the first pixel electrode 82a corresponding to the blue pixel is greater than widths Wb and Wc of the gaps 83b and 83c of the second and third pixel electrodes 82b and 82c, the grayscale inversion of blue at the sides of the LCD can be controlled such that the transmittance of blue is similar to those of red and green and that blue shows grayscale inversion at a similar gray voltage as the gray voltages for the grayscale inversions of red and green. Accordingly, the shifting of the chromaticity coordinates can be reduced, thereby improving the phenomenon in which a display screen appears yellow. Not all gaps 83a of the first pixel electrode 82a corresponding to the blue pixel may be wider than the gaps 83b and 83c of the second and third pixel electrodes 82b and 82c. However, at least one gap of the first pixel electrode 82a may be wider than the gaps 83b and 83c of the second and third pixel electrodes 82b and 82c.

The yellow coloring phenomenon of the display screen can also be improved when a total area of the gaps 83a of the first pixel electrode 82a corresponding to the blue pixel is greater than those of the gaps 83b and 83c of the second and third pixel electrodes 82b and 82c. Here, the gaps 83b and 83c of the second and third pixel electrodes 82b and 82c may have equal or different widths.

Notches (not shown) that can prevent formation of stains or afterimage may be formed in the gaps 83a, 83b or 83c, specifically, in oblique portions of the gaps 83a, 83b or 83c. However, the notches are optional.

The LCD according to the current exemplary embodiment may be formed by aligning and coupling the above-described common electrode display panel of FIG. 1 and the TFT display panel of FIG. 6 together and forming and vertically aligning a liquid crystal layer, which includes liquid crystal molecules, between the common electrode display panel and the TFT display panel.

As described above, the gaps 142a through 142c of the common electrode 140, the gaps 83a through 83c of pixel electrodes 82, and the fine patterns 84 formed in the first pixel electrode 82a can improve the phenomenon in which the display screen is colored in a certain color at the sides thereof due to the shifting of the chromaticity coordinates at the sides of a PVA mode LCD.

Figure 7:
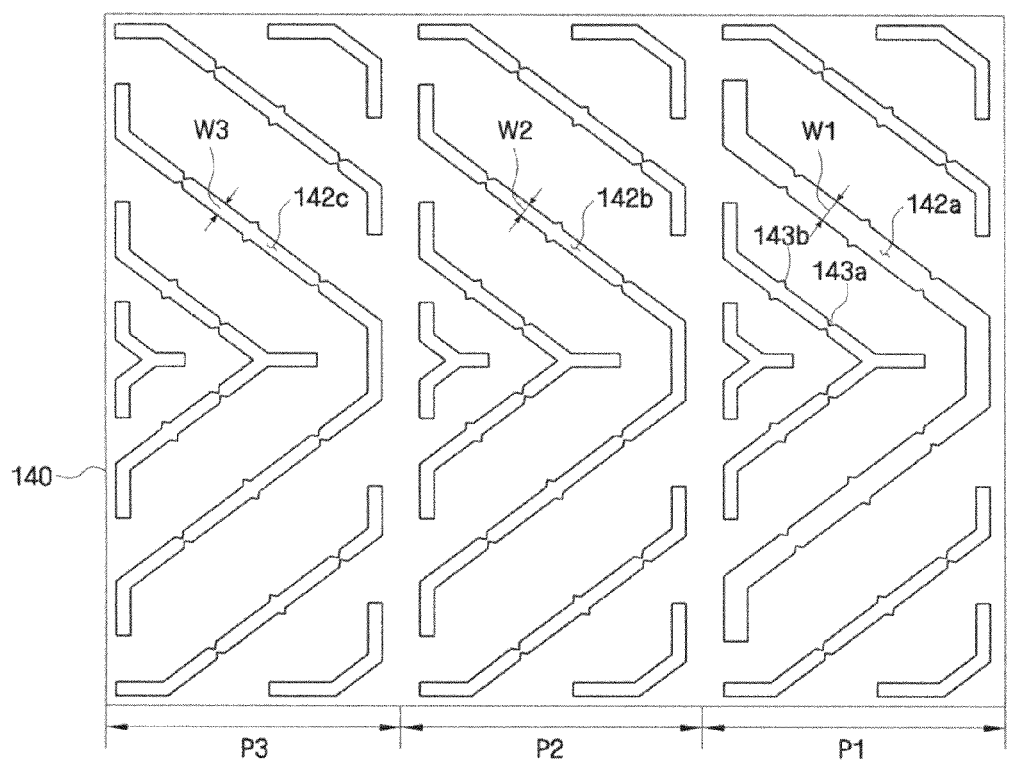
FIG. 7 is a plan view of a common electrode display panel according to another exemplary embodiment.

Hereinafter, a TFT display panel and an LCD according to another exemplary embodiment will be described with reference to FIGS. 7 through 10. For simplicity, elements having the same functions as those of the exemplary embodiments illustrated in FIGS. 1 through 6 are indicated by like reference numerals, and thus their description will be omitted. FIG. 7 is a plan view of a common electrode display panel according to another exemplary embodiment. The common electrode display panel according to the current exemplary embodiment has basically the same structure as the common electrode display panel according to the previous exemplary embodiment, except for the following features.

A common electrode 140 of the common electrode display panel according to the current exemplary embodiment may be partitioned into a plurality of regions by domain partition portions. The domain partition portions may be gaps 142a through 142c formed by cutout patterns.

Each of the gaps 142a through 142c include oblique portions and end portions. The oblique portions are arranged alternately with and parallel to oblique portions of a gap of a pixel electrode, and the end portions overlap edges of the pixel electrode and include vertical and horizontal ends. As shown in FIG. 7, patterns of the gaps 142a through 142c can be changed when necessary, and the number of the gaps 142a through 142c can be increased.

The gaps 142a formed in a first pixel portion P1 of the common electrode 140 may be wider than the gaps 142b and 142c formed in second and third pixel portions P2 and P3. Here, the first pixel portion P1 may correspond to a blue pixel, and each of the second and third pixel portions P2 and P3 may correspond to any one of red and green pixels. Not all of the gaps 142a formed in the first pixel portion P1 may necessarily be wider than the gaps 142b and 142c formed in the second and third pixel portions P2 and P3 as long as any one of the gaps 142a formed in the first pixel portion P1 is wider than corresponding gaps 142b and 142c formed in the second and third pixel portions P2 and P3. If possible, a width W1 of a gap overlapping a first subpixel electrode, which will be described later, among the gaps 142a may be greater than widths W2 and W3 of corresponding gaps formed in the second and third pixel portions P2 and P3.

When the width W1 of the gap overlapping the first subpixel electrode is greater than the widths W2 and W3 of the corresponding gaps, a gamma curve generated by the first subpixel electrode is affected, thereby delaying the point of showing the grayscale inversion. The delayed grayscale inversion can improve the phenomenon in which a display screen appears yellow due to the shifting of the chromaticity coordinates.

Notches 143a and 143b that can prevent formation of stains or afterimage may be formed in gaps 142, specifically, in the oblique portions of the gaps 142. The notches 143a and 143b may be protruding notches 143a or recessed notches 143b as shown in FIG. 7.

Figure 8:
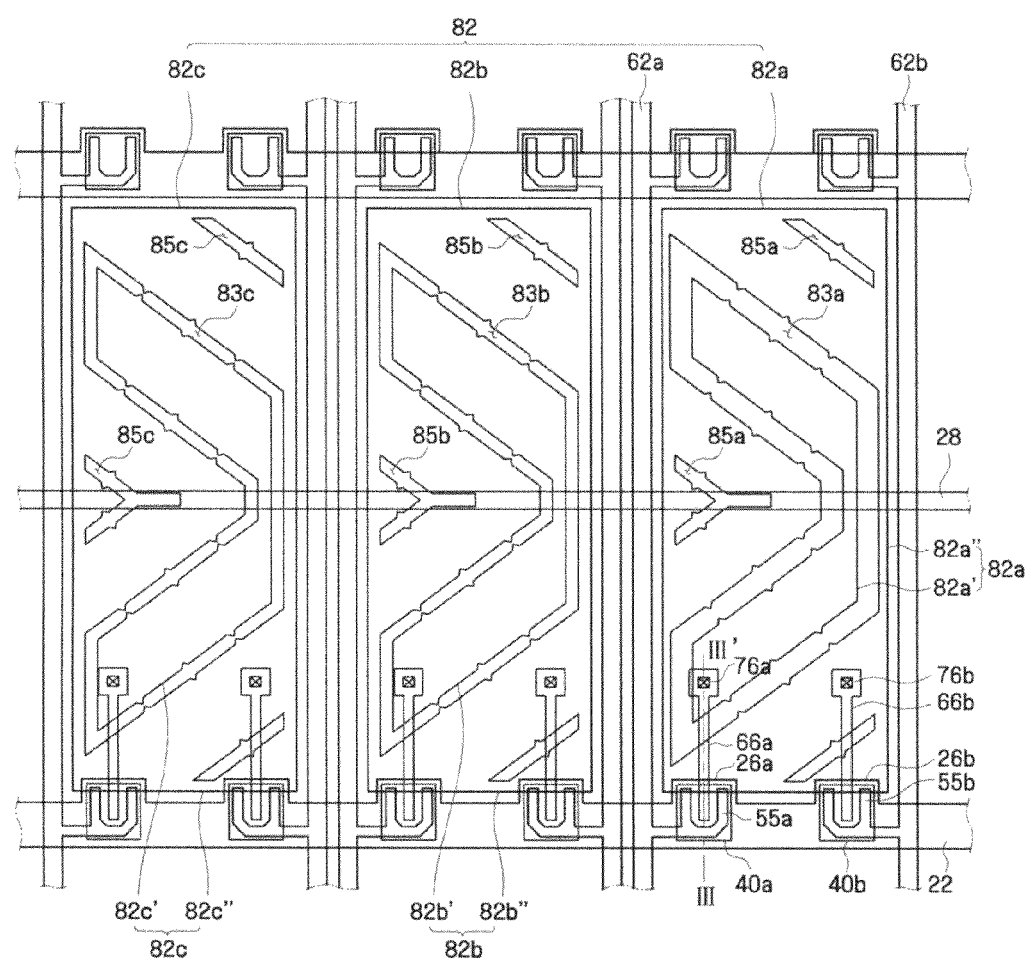
FIG. 8 is a plan view of a TFT display panel according to another exemplary embodiment.
Figure 9:
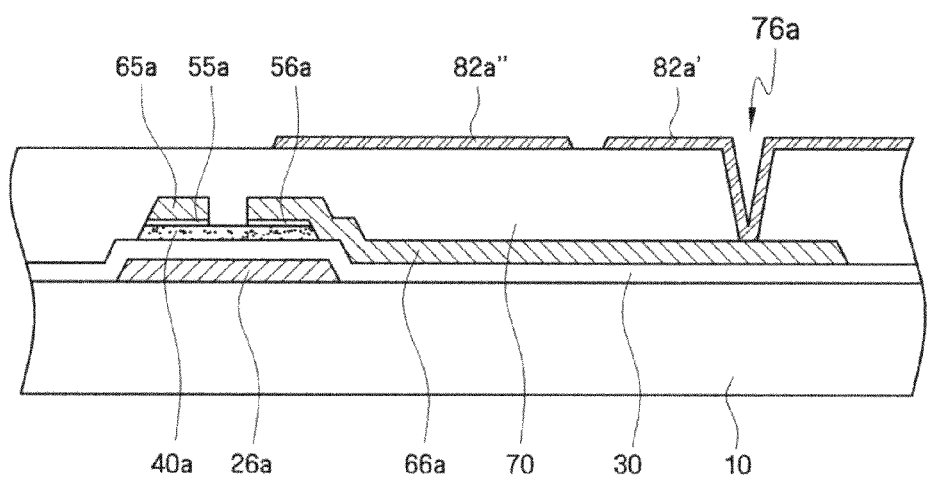
FIG. 9 is a cross-sectional view of the TFT display panel taken along the line III-III' of FIG. 8.

FIG. 8 is a plan view of a TFT display panel according to another exemplary embodiment. FIG. 9 is a cross-sectional view of the TFT display panel taken along the line III-III' of FIG. 8. The TFT display panel of the LCD according to the current exemplary embodiment has basically the same structure as the TFT display panels according to the previous exemplary embodiments, except for the following features.

Referring to FIGS. 8 and 9, a gate line 22 of the TFT display panel according to the current exemplary embodiment has a pair of first and second protruding gate electrodes 26a and 26b.

A pair of first and second data lines 62a and 62b and a pair of first and second drain electrodes 66a and 66b corresponding respectively to the first and second data lines 62a and 62b are formed on ohmic contact layers 55a and 56a and a gate insulating film 30.

The first and second data lines 62a and 62b extend substantially in a vertical direction to intersect the gate line 22 and a storage wiring 28 and deliver data voltages. The first and second data lines 62a and 62b have first and second source electrodes 65a and 65b extending toward the first and second drain electrodes 66a and 66b, respectively.

As shown in FIG. 8, one pixel electrode, for example, a first pixel electrode 82a includes first and second subpixel electrodes 82a' and 82a" which engage with each other with a gap 83a therebetween and are electrically insulated from each other. The first and second subpixel electrodes 82a' and 82a" are physically and electrically connected to the first and second drain electrodes 66a and 66b through first and second contact holes 76a and 76b formed in a passivation film and receive different data voltages from the first and second drain electrodes 66a and 66b, respectively. That is, one pixel is partitioned into a pair of subpixels, and the first data line 62a delivers a data signal to one of the subpixels while the second data line 62b delivers a different data signal to the other one of the subpixels. When provided with data voltages, the first and second subpixel electrodes 82a' and 82a" generate an electric field together with the common electrode 140 to determine the alignment of liquid crystal molecules 310 between the first and second subpixel electrodes 82a' and 82a" and the common electrode 140.

The first and second subpixel electrode 82a' and 82a" may be made of transparent conductors such as ITO or IZO or reflective conductors such as aluminum. The first subpixel electrode 82a' is disposed in a region of a pixel and is shaped like a "V" lying laterally, and the second subpixel electrode 82a" is disposed in the remaining region of the pixel.

The gap 83a which electrically insulates the first and second subpixel electrodes 82a' and 82a" from each other includes oblique portions at an angle of approximately 45 or −45 degrees to the gate line 22 and a vertical portion connecting the oblique portions. Domain partition portions, such as gaps 85a, 85b or 85c, are formed in the second subpixel electrode 82a" and are at an angle of approximately 45 or −45 degrees to the gate line 22.

The gap 83a which electrically insulates the first and second subpixel electrodes 82a' and 82a" of the first pixel electrode 82a from each other may be wider than gaps 83b and 83c that electrically insulate first and second subpixel electrodes 82b' and 82b" and 82c' and 82c" of the second pixel electrode 82b and the third pixel electrode 82c. Here, gamma curves generated by the first subpixel electrodes 82a' through 82c' may show higher transmittances at the same gray voltage than gamma curves generated by the second subpixel electrodes 82a" through 82c".

A pair of gray voltage sets having different gamma curves obtained from one image information are applied to the first and second subpixel electrodes 82a' and 82a", 82b' and 82b", or 82c' and 82c", respectively. A gamma curve for one pixel is a composite gamma curve that combines these gamma curves. In one embodiment, a first subpixel electrode is supplied with a gray voltage set having a gamma curve that shows a higher transmittance at the same gray voltage than that of a gamma curve of a gray voltage set applied to a second subpixel electrode.

As described above, since the grayscale inversion of blue occurs before those of red and green at the sides of a PVA mode LCD, the transmittance of blue is reduced, causing the chromaticity coordinates to shift toward red and green. As a result, the display screen appears yellow. However, if the width of a gap that separates first and second subpixel electrodes of a pixel electrode corresponding to a pixel in which grayscale inversion occurs is increased, the point of showing the grayscale inversion on a gamma curve of the first subpixel electrode, which shows a higher transmittance at the same gray voltage, is delayed. This delay of grayscale inversion is reflected in a composite gamma curve, thereby improving the phenomenon in which the screen is colored in a certain color.

The first pixel electrode 82a may correspond to a blue pixel. When the first pixel electrode 82a corresponds to the blue pixel, the point of showing the grayscale inversion of blue on a gamma curve generated by the first subpixel electrode 82a' corresponding to the blue pixel is delayed. Accordingly, grayscale inversion characteristics of blue on a composite gamma curve are adjusted to be similar to those of red and green. This adjustment reduces the shifting of the chromaticity coordinates which happens when the grayscale inversion of blue occurs earlier than those of red and green at the sides of an LCD. Consequently, the phenomenon in which the display screen appears yellow due to the shifting of the chromaticity coordinates can be improved.

Figure 10:
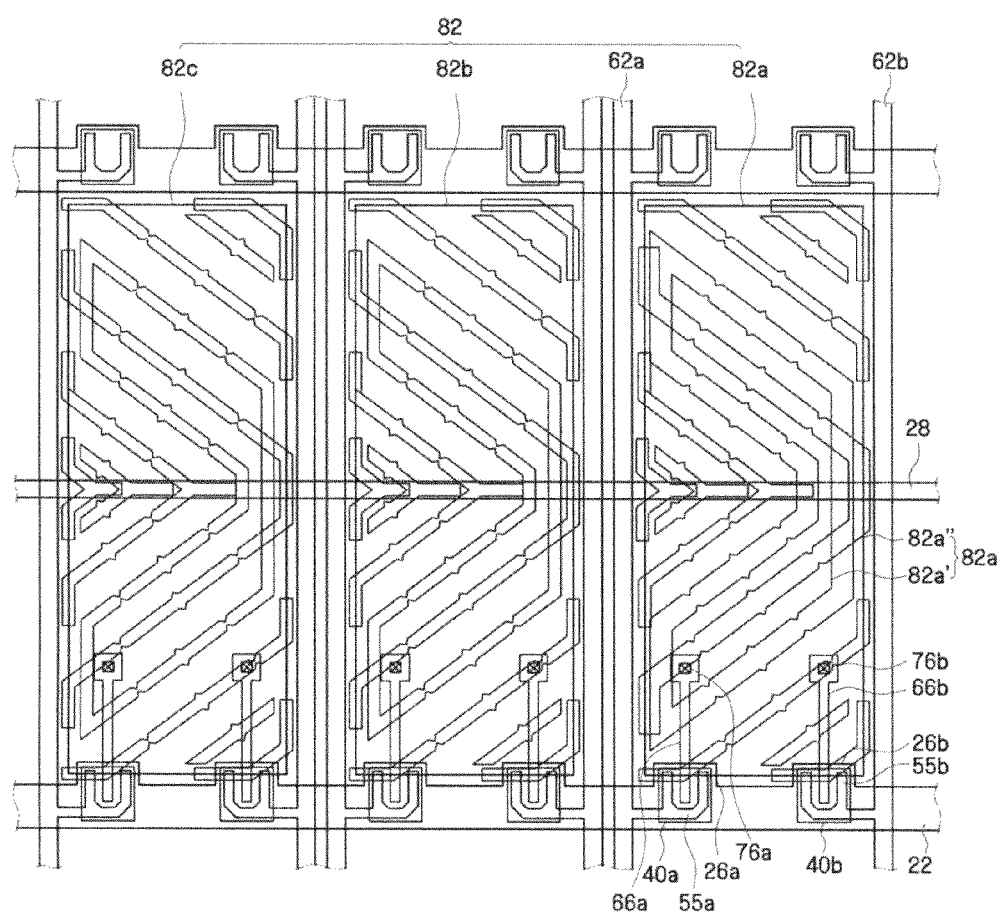
FIG. 10 is a plan view of an LCD according to another exemplary embodiment in which the common electrode display panel of FIG. 7 is coupled to the TFT display panel of FIG. 8.

FIG. 10 is a plan view of the LCD in which the common electrode display panel of FIG. 7 is coupled to the TFT display panel of FIG. 8. Referring to FIG. 10, the oblique portions of the gaps 83a through 83c of pixel electrodes 82 are arranged alternately with and parallel to the oblique portions of the gaps 142a through 142c of the common electrode 140 to form a vertical electric field. In addition, the common electrode display panel of FIG. 7 and the TFT display panel of FIG. 8 are aligned and coupled to each other, and a liquid crystal layer composed of liquid crystal molecules is formed and vertically aligned between the common electrode display panel and the TFT display panel, thereby completing the basic structure of the LCD according to the current exemplary embodiment.

Figure 11:
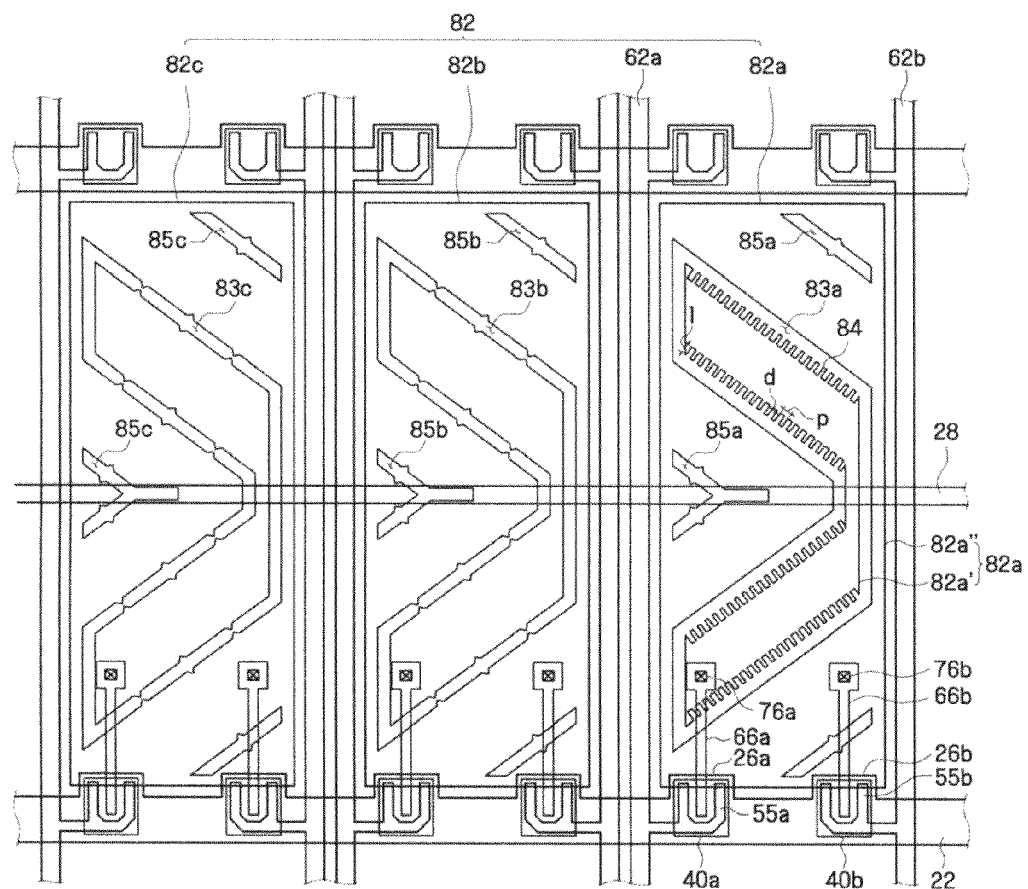
FIG. 11 is a plan view of a TFT display panel according to another exemplary embodiment.

Hereinafter, a TFT display panel and an LCD including the same according to another exemplary embodiment will be described with reference to FIGS. 11 and 12. For simplicity, elements having the same functions as those of the exemplary embodiments illustrated in FIGS. 1 through 6 are indicated by like reference numerals, and thus their description will be omitted. FIG. 11 is a plan view of a TFT display panel according to another exemplary embodiment. The TFT display panel according to the current exemplary embodiment has basically the same structure as the TFT display panels according to the previous exemplary embodiments, except for the following features.

Referring to FIG. 11, saw-toothed fine patterns 84 may be formed on edges, preferably oblique edges of a first subpixel electrode 82a' of a first pixel electrode 82a. The fine patterns 84 are not formed on second and third pixel electrodes 82b and 82c and are formed only on the first pixel electrode 82a. The first subpixel electrode 82a' may have a gamma curve which shows a higher transmittance at the same gray voltage than that of a gamma curve of a second subpixel electrode 82a''.

The fine patterns 84 formed on the first subpixel electrode 82a' of the first pixel electrode 82a may change the gamma curve of the first subpixel electrode 82a'. Since the first subpixel electrode 82a' has a higher transmittance than the second subpixel electrode 82a'' at the same gray voltage, grayscale inversion characteristics of a gamma curve having a higher transmittance can be adjusted on a composite gamma curve. If the fine patterns 84 are formed on the first subpixel electrode 82a' of the first pixel electrode 82a corresponding to a blue pixel as shown in FIG. 11, the point of showing the grayscale inversion on a gamma curve generated by the first subpixel electrode 82a' is delayed. Accordingly, grayscale inversion characteristics of the blue pixel become similar to those of red and green pixels. This reduces the shifting of the chromaticity coordinates, which, in turn, improves the phenomenon in which a screen appears yellow at the sides thereof.

The fine patterns 84 include a plurality of protrusions extending perpendicularly from each edge of the first subpixel electrode 82a'. The protrusions that constitute the fine patterns 84 may be at an angle of approximately 45 or −45 degrees to a gate line 22. A length "l" of the protrusions of the fine patterns 84 in a direction perpendicular to each edge of the first subpixel electrode 82a' may be 5 to 15 micrometers. In addition, a distance "d" between one of the protrusions and another protrusion adjacent to the protrusion may be 2 micrometers or less, and a sum "p" of the distance "d" between adjacent protrusions and a width of one protrusion may be 8 micrometers or less. When fine patterns with dimensions in the above ranges are formed on a pixel electrode, the grayscale inversion of a pixel corresponding to the pixel electrode may be controlled without a reduction in the transmittance of the pixel. As a result, the phenomenon in which the display screen is colored in a certain color can be effectively improved.

Figure 12:
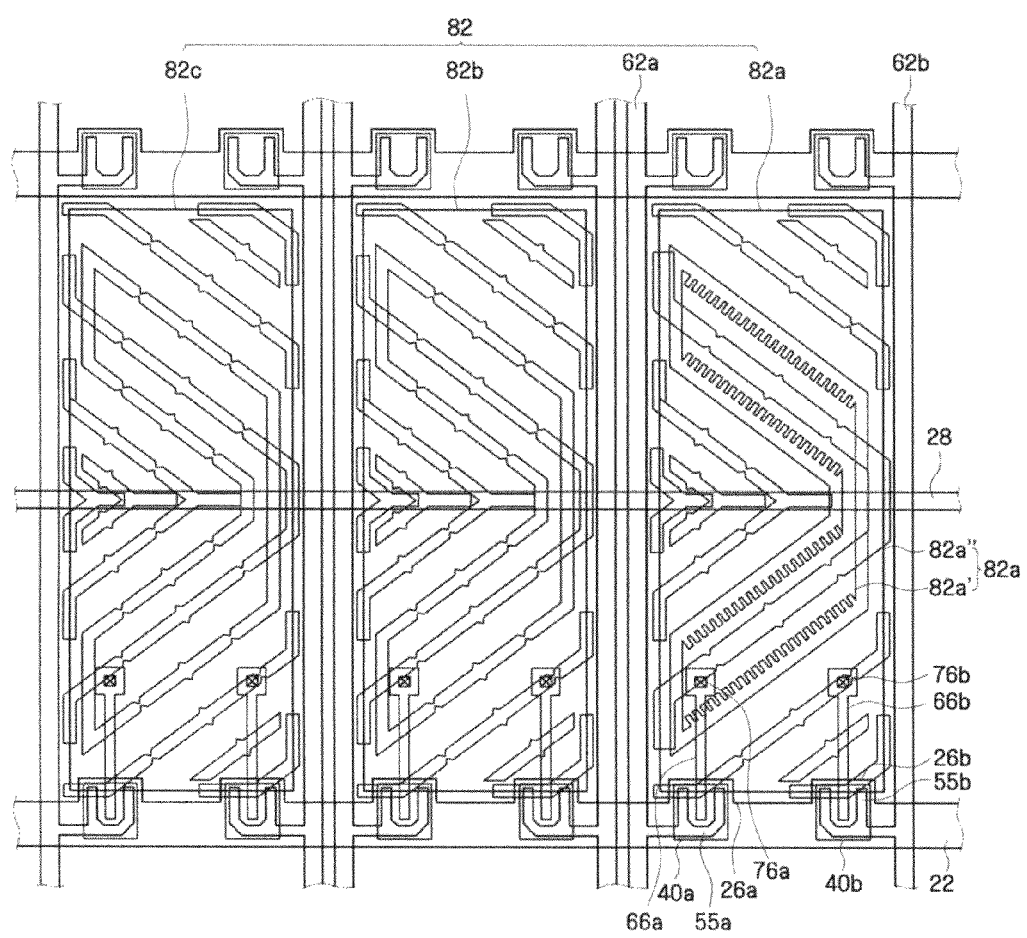
FIG. 12 is a plan view of an LCD according to another exemplary embodiment in which the common electrode display panel of FIG. 7 is coupled to the TFT display panel of FIG. 11.

FIG. 12 is a plan view of an LCD in which the common electrode display panel of FIG. 7 is coupled to the TFT display panel of FIG. 11. Referring to FIG. 12, the saw-toothed fine patterns 84 are formed on the first subpixel electrode 82a' of the first pixel electrode 82a of the TFT display panel. Additionally, a gap, which overlaps the first subpixel electrode 82a', in the first pixel portion P1 of the common electrode 140 is formed wider than corresponding gaps in the second and third pixel portions P2 and P3. As a result, the phenomenon in which the screen appears yellow at the sides thereof due to the shifting of the chromaticity coordinates at the sides of the LCD can be improved.

Effects of the claimed subject matter will be described in further detail with reference to the following examples. These examples are for illustrative purposes only and are not intended to limit the scope of the claimed subject matter.

Example 1

Improving the Shifting of Chromaticity Coordinates by Adjusting a Gap Width of a Common Electrode Gaps of the common electrode display panel of FIG. 7 were formed to have widths as shown in Table 1, and the common electrode display panel was coupled to a TFT display panel to produce an LCD. The TFT display panel is identical to the TFT display panel of FIG. 8 except that gaps of first through third pixel electrodes have equal widths.

Figure 13:
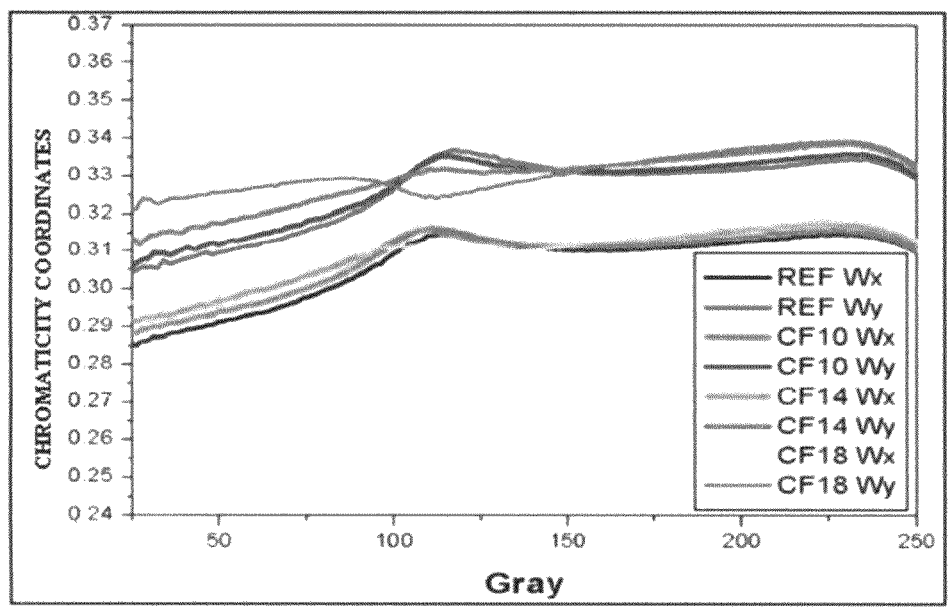
FIGS. 13 and 14 are graphs illustrating chromaticity coordinates of an LCD according to an exemplary embodiment which were measured after ACC tuning.

Transmittance and the shifting of chromaticity coordinates after ACC tuning were measured, and the measurement results are shown in Table 1 and FIG. 13.

TABLE 1

| Category | Reference | 1 | 2 | 3 |
| --- | --- | --- | --- | --- |
| Gap width (μm) | 8 | 10 | 14 | 18 |
| Transmittance (%) | 4.65 | 4.62 | 4.61 | 4.56 |

Referring to Table 1 and FIG. 13, an increase in gap width reduces the shifting of the chromaticity coordinates as shown in FIG. 13 without resulting in a lower transmittance than that of Reference LCD. Therefore, the phenomenon in which the display screen appears yellow because the chromaticity coordinates are shifted toward red and green can be improved.

Example 2

Improving the Shifting of Chromaticity Coordinates Using Fine Patterns

A common electrode display panel identical to the common electrode display panel of FIG. 7 was coupled to the TFT display panel of FIG. 10 to produce an LCD. The common electrode display panel is identical to the common electrode display panel of FIG. 7 except that gaps of a first pixel portion have equal widths. In addition, in the TFT display panel, a length of saw-toothed fine patterns of a pixel electrode in a direction perpendicular to each oblique edge of the pixel electrode was as shown in Table 2. After the LCD was produced as described above, its transmittance and chromaticity coordinates after ACC tuning were measured, and the measurement results are shown in Table 2 and FIG. 14. In the case of Experimental example 7, gaps of a first pixel portion of a common electrode had a width of 14 μm, and gaps of second and third pixel portions had a width of 8 μm.

TABLE 2

| Category | Reference | 4 | 5 | 6 | 7 |
|---|---|---|---|---|---|
| Length of fine patterns (μm) | No fine patterns | 6 | 10 | 14 | 10 |
| Transmittance (%) | 4.65 | 4.63 | 4.63 | 4.63 | 4.60 |

Figure 14:
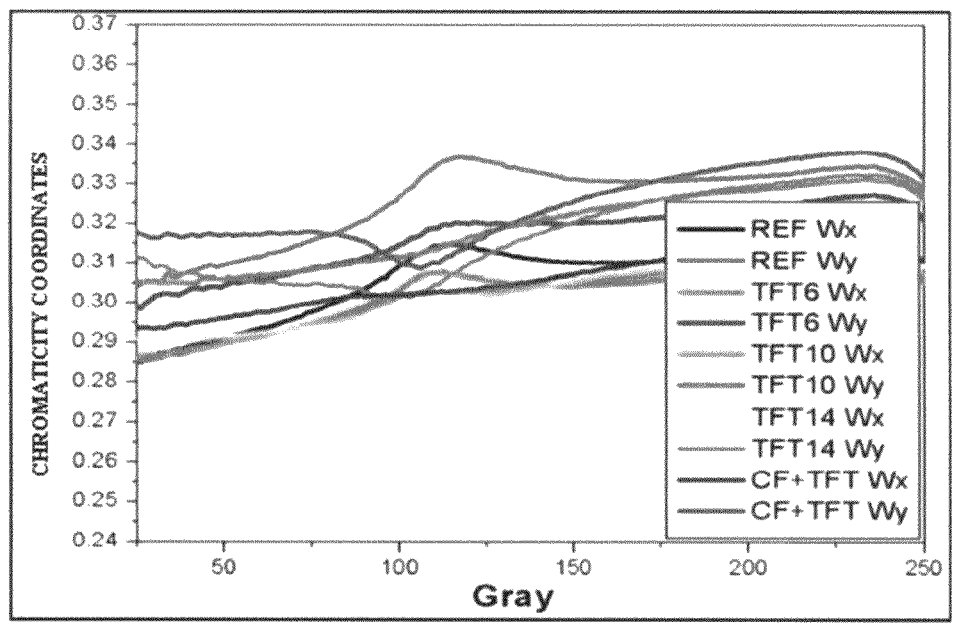

Referring to Table 2, the formation of fine patterns on a pixel electrode does not result in a reduction in transmittance. In addition, as shown in FIG. 14, the fine patterns cause the shifting of the chromaticity coordinates to be reduced, as compared with the shifting of the chromaticity coordinates of the reference LCD without fine patterns. Therefore, the phenomenon in which the display screen appears yellow because the chromaticity coordinates are shifted toward red and green can be improved.

As described above, in an LCD according to an exemplary embodiment, gaps of a first pixel portion of a common electrode are formed wider than those of second and third pixel portions, or fine patterns are formed on a first pixel electrode. Accordingly, the shifting of chromaticity coordinates caused by the grayscale inversion of blue at the sides of a PVA mode LCD can be reduced, thereby improving the phenomenon in which the display screen appears yellow.

In an LCD employing a common electrode display panel and a TFT display panel according to an exemplary embodiment, gamma curves and grayscale inversions of pixels are adjusted to be similar, thereby improving the phenomenon in which the screen is colored in a certain color at the sides thereof.

In an LCD according to an exemplary embodiment, the shifting of the chromaticity coordinates caused by the grayscale inversion of blue before those of red and green at the sides of the LCD can be reduced, thereby improving the phenomenon in which the screen appears yellows.

However, the effects of the claimed subject matter are not restricted to the one set forth herein. The above and other effects will become more apparent to one of daily skill in the art by referencing the claims.

While the claimed subject matter has been particularly shown and described with reference to exemplary embodiments thereof, it will be understood by those of ordinary skill in the art that various changes in form and detail may be made therein without departing from the intended spirit and scope defined by the following claims. The exemplary embodiments should be considered in a descriptive sense only and not for purposes of limitation.

What is claimed is:

1. A thin-film transistor (TFT) display panel comprising:
a first substrate;
a plurality of gate lines formed on the first substrate and extending in a first direction;
a plurality of data lines intersecting the gate lines and extending in a second direction;
a plurality of pixel regions defined by the gate lines and the data lines; and
a plurality of pixel electrodes formed in the pixel regions and comprising a first pixel electrode corresponding to a first pixel, a second pixel electrode corresponding to a second pixel, and a third pixel electrode corresponding to a third pixel,
wherein saw-toothed patterns are formed on oblique edges of the first pixel electrode, and wherein the second pixel electrode and the third pixel electrode comprise no saw-toothed patterns.

2. The TFT display panel of claim 1, wherein the first pixel is blue.

3. The TFT display panel of claim 1, wherein the second pixel is red or green.

4. The TFT display panel of claim 1, wherein the saw-toothed patterns comprise a plurality of protrusions extending perpendicularly from each oblique edge of the first pixel electrode.

5. The TFT display panel of claim 1, wherein the second pixel electrode is disposed between the first pixel electrode, which comprises the saw-toothed patterns, and the third pixel electrode, which comprises no saw-toothed patterns.

6. The TFT display panel of claim 1, wherein each of the first through third pixel electrodes comprises a first subpixel electrode and a second subpixel electrode, and
wherein the first subpixel electrode and the second subpixel electrode are electrically insulated from each other by a gap, wherein the gap of the first pixel electrode is wider than the gap of the second pixel electrode and is wider than the gap of the third pixel electrode.

7. A liquid crystal display (LCD) comprising:
a first display panel comprising a first insulating substrate and a common electrode that is formed on the first insulating substrate and is partitioned into a plurality of pixel portions comprising a first pixel portion facing a first pixel electrode, a second pixel portion facing a second pixel electrode, and a third pixel portion facing a third pixel electrode; and
a second display panel comprising a second insulating substrate, a plurality of pixel electrodes that are formed on the second insulating substrate and comprises the first pixel electrode corresponding to a first pixel, the second pixel electrode corresponding to a second pixel, and the third pixel electrode corresponding to a third pixel, and a plurality of data lines configured to apply data voltages to the pixel electrodes,
wherein the first pixel electrode is a blue pixel electrode having a first gap formed in the first pixel electrode,
wherein the second pixel electrode has a second gap formed in the second pixel electrode that is narrower than the first gap,
wherein the first pixel portion has a third gap and a second pixel portion has a fourth gap, and
wherein the fourth gap is narrower than the third gap.

8. The LCD of claim 7, wherein the first pixel electrode comprises a first subpixel electrode having saw-toothed patterns formed on an oblique edge of the first subpixel electrode.

9. The LCD of claim 7, wherein each of the first through third pixel electrodes is partitioned into a plurality of domains by domain partition portions.

10. The LCD of claim 9, wherein the domain partition portions are the gaps.

11. The LCD of claim 8, wherein the saw-toothed patterns comprise a plurality of protrusions extending perpendicularly from each oblique edge of the first subpixel electrode.

12. The LCD of claim 8, wherein the first subpixel electrode is smaller than a corresponding subpixel electrode of the second pixel electrode that is surrounded by another subpixel electrode of the second pixel electrode.

13. The LCD of claim 8, wherein the first gap, which separates the first subpixel electrode and the second subpixel electrode from each other, is wider than a gap that separates two subpixel electrodes of the third pixel electrode.

14. The LCD of claim 8, wherein a gamma curve generated by the first subpixel electrode shows a higher transmittance at a same gray voltage than a gamma curve generated by the second subpixel electrode.

15. The LCD of claim 8, wherein the second subpixel electrode surrounds the first subpixel electrode.

16. The LCD of claim 8, wherein the first subpixel electrode is V-shaped and formed in a region of the first pixel electrode, and the second subpixel electrode is formed in the remaining region of the first pixel electrode.

17. The LCD of claim 8, wherein the first subpixel electrode and the second subpixel electrode are connected to different switching elements, respectively.

18. The LCD of claim 8, wherein each of the first through third pixel portions comprises gaps, wherein a gap, which overlaps the first subpixel electrode, in the first pixel portion of the common electrode is wider than gaps of the second and third pixel portions.

* * * * *